United States Patent
Bensch

(10) Patent No.: US 9,887,308 B2
(45) Date of Patent: Feb. 6, 2018

(54) SOLAR CELL UNIT

(71) Applicant: AZUR SPACE Solar Power GmbH, Heilbronn (DE)

(72) Inventor: Werner Bensch, Nordheim (DE)

(73) Assignee: Azur Space Solar Power GmbH, Heilbronn (DE)

( * ) Notice: Subject to any disclaimer, the term of this patent is extended or adjusted under 35 U.S.C. 154(b) by 0 days.

(21) Appl. No.: 15/468,463

(22) Filed: Mar. 24, 2017

(65) Prior Publication Data

US 2017/0278996 A1    Sep. 28, 2017

(30) Foreign Application Priority Data

Mar. 24, 2016   (DE) .................. 10 2016 003 487

(51) Int. Cl.
| | |
|---|---|
| *H01L 31/054* | (2014.01) |
| *H01L 31/0475* | (2014.01) |
| *H02S 30/10* | (2014.01) |
| *H01L 31/02* | (2006.01) |
| *H01L 31/0224* | (2006.01) |
| *H01L 31/0687* | (2012.01) |

(52) U.S. Cl.
CPC .... *H01L 31/0543* (2014.12); *H01L 31/02008* (2013.01); *H01L 31/022433* (2013.01); *H01L 31/0475* (2014.12); *H01L 31/0687* (2013.01); *H02S 30/10* (2014.12); *Y02E 10/544* (2013.01)

(58) Field of Classification Search
CPC ............. H01L 31/0475; H01L 31/0543; H01L 31/022433; H01L 31/0687; H01L 31/02008
See application file for complete search history.

(56) References Cited

U.S. PATENT DOCUMENTS

| | | | | |
|---|---|---|---|---|
| 4,836,861 | A | * | 6/1989 | Peltzer .............. H01L 31/02008 136/244 |
| 5,081,049 | A | * | 1/1992 | Green ................. H01L 31/0236 136/246 |
| 5,091,018 | A | | 2/1992 | Fraas et al. |

(Continued)

FOREIGN PATENT DOCUMENTS

| | | |
|---|---|---|
| DE | 10 2008 035 735 A1 | 2/2010 |
| DE | 10 2008 055 475 A1 | 6/2010 |

(Continued)

*Primary Examiner* — Golam Mowla

(74) *Attorney, Agent, or Firm* — Muncy, Geissler, Olds & Lowe, P.C.

(57) ABSTRACT

A solar cell unit having a semiconductor body formed as a solar cell, whereby the semiconductor body has a front side and a back side, and the solar cell unit has a carrier with a top side and a bottom side, whereby a first contact surface and a second contact surface are formed on the top side, and the first contact surface is spaced apart from the second contact surface and the contact surfaces are metallically conductive and the back side of the semiconductor body is non-positively connected to the top side of the carrier. The solar cell unit has a secondary optical element to guide light to the front side of the semiconductor body, whereby the secondary optical element has a bottom side and the bottom side is non-positively connected to the front side of the semiconductor body.

17 Claims, 2 Drawing Sheets

(56) References Cited

U.S. PATENT DOCUMENTS

| | | | |
|---|---|---|---|
| 5,240,510 A * | 8/1993 | Goldade | H01L 31/02168 136/255 |
| 5,728,230 A * | 3/1998 | Komori | B32B 17/02 136/251 |
| 5,759,291 A * | 6/1998 | Ichinose | H01L 31/022425 136/256 |
| 5,942,048 A * | 8/1999 | Fujisaki | H01L 31/022425 136/244 |
| 5,973,258 A * | 10/1999 | Shiotsuka | B32B 17/10678 136/251 |
| 6,121,542 A * | 9/2000 | Shiotsuka | H01L 31/022425 136/256 |
| 7,687,708 B2 * | 3/2010 | Takeyama | H01L 31/02008 136/251 |
| 8,680,656 B1 | 3/2014 | Kuo et al. | |
| 2008/0257402 A1 | 10/2008 | Kamp et al. | |
| 2010/0132793 A1 | 6/2010 | Nakamua et al. | |
| 2010/0224250 A1 | 9/2010 | Hong et al. | |
| 2011/0011452 A1 | 1/2011 | Lin et al. | |
| 2011/0265852 A1 | 11/2011 | Loeckenhoff et al. | |
| 2015/0144189 A1 | 5/2015 | Khorenko et al. | |

FOREIGN PATENT DOCUMENTS

| | | |
|---|---|---|
| EP | 2 073 279 A1 | 6/2009 |
| WO | WO 2007/045695 A1 | 4/2007 |
| WO | WO 2014/019652 A1 | 2/2014 |

* cited by examiner

SOLAR CELL UNIT

This nonprovisional application claims priority under 35 U.S.C. § 119(a) to German Patent Application No. 10 2016 003 487.4, which was filed in Germany on Mar. 24, 2016, and which is herein incorporated by reference.

BACKGROUND OF THE INVENTION

Field of the Invention

The invention relates to a solar cell unit.

Description of the Background Art

Solar cell receivers, as they are known, for example, from WO 2014/019652 A1, which corresponds to US 2015/0144189, which is incorporated herein by reference or from EP 2 073 279 A1, which corresponds to US 2010/0132793, typically have a semiconductor body arranged on a carrier. A primary and a secondary optical element are arranged above the semiconductor body to conduct sunlight to the surface of the semiconductor body. The semiconductor body has a first and a second terminal contact for electrical contacting, each terminal contact being electrically connected to a contact surface, e.g., a trace region, arranged on the carrier.

A plug system for a plurality of photovoltaic modules is known from WO 2007/045 695 A1, which corresponds to US 2008/0257402. Devices with solar cells on carriers are known from DE 10 2008 035 735 A1 (which corresponds to US 2011/0265852), U.S. Pat. No. 8,680,656 B1, U.S. Pat. No. 5,091,018 A, DE 10 2008 055 475 A1, US 2010/0 224 250 A1, and US 2011/0 011 452 A1.

SUMMARY OF THE INVENTION

It is therefore an object of the invention to provide a device that refines the prior art and enables a production as cost-effective as possible.

According to an exemplary embodiment of the invention, a solar cell unit is provided that has a semiconductor body, formed as a solar cell, a carrier, and a secondary optical element.

The semiconductor body has a front side and a back side and a first terminal contact with a first polarity and a second terminal contact with a second polarity, whereby the two polarities are different. The semiconductor is formed quadrangular on the top side. Preferably, the first terminal contacts are formed on two opposite sides in each case at the edge. Preferably, the second terminal contact substantially covers the entire back side of the semiconductor body. An advantage of the full-surface back-side contacting is that there is good thermal coupling with the carrier to prevent overheating of the solar cell in particular at temperatures above 100° C.

The carrier has a top side and a bottom side, whereby a first contact surface and a second contact surface are formed on the top side, and the first contact surface is spaced apart from the second contact surface, and the contact surfaces are metallically conductive and electrically connected to the two terminal contacts.

The back side of the semiconductor body is non-positively connected to the top side of the carrier.

The secondary optical element has a bottom side and guides light to the front side of the semiconductor body. The bottom side is non-positively connected to the front side of the semiconductor body.

The carrier has a third contact surface formed on the top side, whereby the third contact surface is spaced apart from both the first contact surface and the second contact surface.

The second contact surface has a different polarity than the two other contact surfaces.

The solar cell can be a III-V semiconductor solar cell with a GaAs or Ge base or a different semiconductor material or a suitable substrate and the solar cell is formed most preferably as a multi-junction solar cell arranged in a stack and, inter alia, by utilizing UV light components has an efficiency above 30%.

Solar cell units of this type are preferred to be used in so-called CPV (Concentrating Photovoltaic) systems as compared with silicon solar cells higher manufacturing costs, and particular their physical properties.

In the CPV systems, the sunlight is bundled by factors above 100 to above 1000. In this case, the light bundled by means of a primary optical concentrator or element is conducted to the secondary optical element of the solar cell unit.

The primary element, for example, a Fresnel lens, is arranged above the secondary optical element. The light is conducted from the secondary optical element along the optical axis to an adhesive layer, in particular, a polymer adhesive layer, so as to penetrate the adhesive layer and to fall on the front side of the semiconductor body, the solar cell.

An electrical contact with the solar cell unit with another solar cell unit is produced via the particular contact surfaces. The contact surfaces of a plurality of solar cell units are hereby electrically connected, for example, by resistance spot welding to a metallic connecting element. The metallic connecting element can be formed in the shape of a wire or as a wire. In a further embodiment, a contact tab is electrically connected to the contact surface. So as to connect a plurality of solar cell units, the contact tabs of the solar cell units are connected by metallic connecting elements.

An advantage of the device of the invention is that the second contact surface has a different polarity than the two other contact surfaces. In particular, the second contact surface is formed as a middle contact surface. In this way, crossing of electrical connecting elements in a particularly meander-shaped series connection of a plurality of solar cell units on a base can be prevented in a simple manner. The reliability of the arrangement is substantially increased.

A further advantage is that the connecting elements must be angled at the ends to avoid short circuits. Intermediate contact points are also not necessary to carry out crossing-free wiring, i.e., a series connection without any crossing even when the direction of the connecting elements changes.

In an embodiment, the first terminal contact can be formed on the front side and the second terminal contact on the back side or both terminal contacts can be arranged on the front side or both terminal contacts can be arranged on the back side.

In an embodiment, at least parts of the bottom side of the secondary optical element are non-positively connected to the front side of the semiconductor body and/or to the top side of the carrier by an adhesive layer or in particular a polymer adhesive layer. In particular, the polymer adhesive layer can be UV-transparent. It should be noted that the term adhesive layer or in particular the term polymer adhesive layer can comprise a plastic layer.

In an embodiment, the first contact surface and the third contact surface are electrically connected to the first terminal contact and the second contact surface to the second terminal contact or the first contact surface and the third contact surface are electrically connected to the second terminal contact and the second contact surface to the first terminal contact.

In an embodiment, the carrier has four edges on the top side, whereby the first contact surface, second contact surface, and third contact surface are arranged in the indicated sequence along the first edge on the top side of the carrier.

The single-sided arrangement of the contact surfaces along a single edge of the carrier has the further advantage that the size of the carrier can be considerably reduced in comparison with typical multisided distributed arrangements of contact surfaces. The novel very small carrier surfaces are also sufficient to remove the heat generated during intensive solar irradiation. The one-sided arrangement of connecting contacts in close proximity to the solar cell or to the bottom side of the optical element even promotes the removal of the tremendous heat, in particular, if the contact surfaces are made especially large or with contact tabs. In particular, in the pre-wired state, i.e., in the formation of an array, the heat removal by the electrical connecting wires can be increased further hereby. The size of the solar cell and of the optical element can be decisive for the size of the carrier. There is a further advantage of the saving of space by at least 15% to at least 30% compared with conventional carriers that are at least 3.0 mm by 3.5 mm in size. The saving of material for the carrier results in a substantial resource-saving and cost-effective manufacturing option.

Because the solar cell units always have two outer contact surfaces with a first polarity and a middle contact surface with a second polarity, a series connection of a plurality of solar cell units with a meandering arrangement without crossing of the electrical connecting elements, connecting the solar cell units, is possible in an especially simple and reliable way also in a one-sided arrangement of the contact surfaces.

The carrier can be formed quadrangular, for example, as a rectangle, at least on the top side. In particular, the carrier is made as a planar plate, preferably as a ceramic printed circuit board or as a printed circuit board with an insulated metal substrate.

According to an embodiment, the first, second, and third contact surfaces are made as traces or in each case as soldering lugs.

Whereas the distance of the first edge of the carrier from the secondary optical element is so large that the three contact surfaces can be arranged along the first edge, the second, third, and fourth edges need to have only a minimum distance from the second optical element. As a result, there can be a saving of carrier material and costs. This can be of advantage particularly in a ceramic carrier.

In an embodiment, in a projection extending perpendicular to the top side of the carrier, the lateral distance of the bottom side of the secondary optical element from the first edge of the top side of the carrier is at least 1 mm or preferably at least 3 mm and the distance from the second edge, from the third edge, and from the fourth edge is at most 10 mm or at most 4 mm or preferably at most 2 mm, preferably at most 1 mm, or in a range between 0 mm and 0.2 mm. The distance from the edge can be taken to mean in each case the shortest route between the virtual border of the optical element, said border produced by the projection on the top side of the carrier, and the edge directly adjacent to said border.

An advantage of the asymmetrical arrangement is that the size of the carrier of the secondary optical element is reduced. In particular, the one-sided providing of the carrier surface for the contact surfaces to be arranged contributes to this.

In an embodiment, the first and/or second and/or third contact surface adjoin along at least 75% or at least 90% of the length of the first edge.

In an embodiment, in a projection extending perpendicular to the top side of the carrier, the three contact surfaces are arranged spaced apart from the bottom side of the secondary optical element.

In an embodiment, the solar cell unit has a substantially rectangular base area of a maximum 20 mm×26 mm or preferably of a maximum 16 mm×22 mm edge length.

According to an embodiment, the secondary optical element can be made lens-shaped with a convex surface, facing away from the semiconductor body, or funnel-shaped.

In an embodiment, the secondary optical element can be made as a single piece.

In an embodiment, the secondary optical element can comprises or be formed of a glass compound or a quartz glass compound.

In an embodiment, a solar cell module has at least one first, second, and third solar cell unit of the above-described type and at least one first and second metallic connecting element, whereby the first, second, and third solar cell units are arranged with the bottom side on a base plate, the first metallic connecting element electrically connects the third contact surface of the first solar cell unit to the second contact surface of the second solar cell unit, and the second metallic connecting element connects the third contact surface of the second solar cell unit to the second contact surface of the third solar cell unit, whereby the first metallic connecting element in a projection, extending perpendicular to the surface of the base plate, overlaps the first contact surface of the second solar cell unit.

It is advantageous because of the particular mechanical stability to use a wire or a wire-like electrical conductor as a metallic connecting element for a bridge-shape or arch-shaped design.

It should be noted that the metallic connecting elements are typically connected to the contact surfaces by means of a resistance spot welding connection. The contact surfaces are typically formed entirely flat or alternatively as an angled contact tab. The contact tabs are preferably covered with solder.

Crossings can be avoided in a simple way by the third contact surface with a polarity that is identical to the first contact surface relatively independent of the arrangement and orientation of the plurality of solar cell units to one another, in particular, in a one-sided arrangement of the contact surfaces. This is especially advantageous for a typically meander-shaped arrangement of solar cell units connected in series.

In an embodiment, the base plate comprises a metal or a nonmetal or a plastic or a glass-fiber-reinforced plastic material or formed of one such material.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
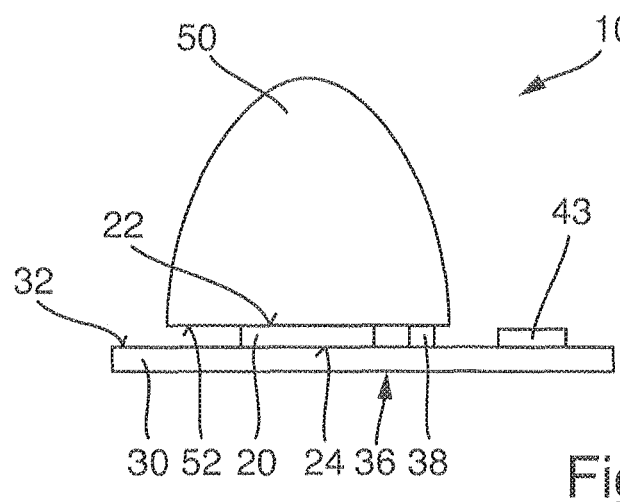
FIG. 1 shows a side view of an embodiment of the invention of a solar cell unit.

The illustration in FIG. 1 shows a side view of an embodiment of a solar cell unit 10, having a semiconductor body 20, a carrier 30, a bottom side 36, and a secondary optical element 50. The illustration of FIG. 2 shows a schematic top view of solar cell unit 10 illustrated in FIG. 1.

Semiconductor body 20 is non-positively connected with a back side 24 to a top side 32 of carrier 30. A front side 22 is completely covered by secondary optical element 50, whereby secondary optical element 50 is made as a convex lens and a planar bottom side 52 of secondary optical element 50 is non-positively connected by a polymer adhesive layer (not shown) at least partially to front side 22 of semiconductor body 20. Bottom side 52 of secondary optical element 50 in the illustrated exemplary embodiment, furthermore, covers a protection diode 38 disposed on top side 32 of carrier 30. It should be noted that in an embodiment that is not shown, protection diode 38 is not covered or only partially covered by the bottom side of secondary optical element 50.

Figure 2:
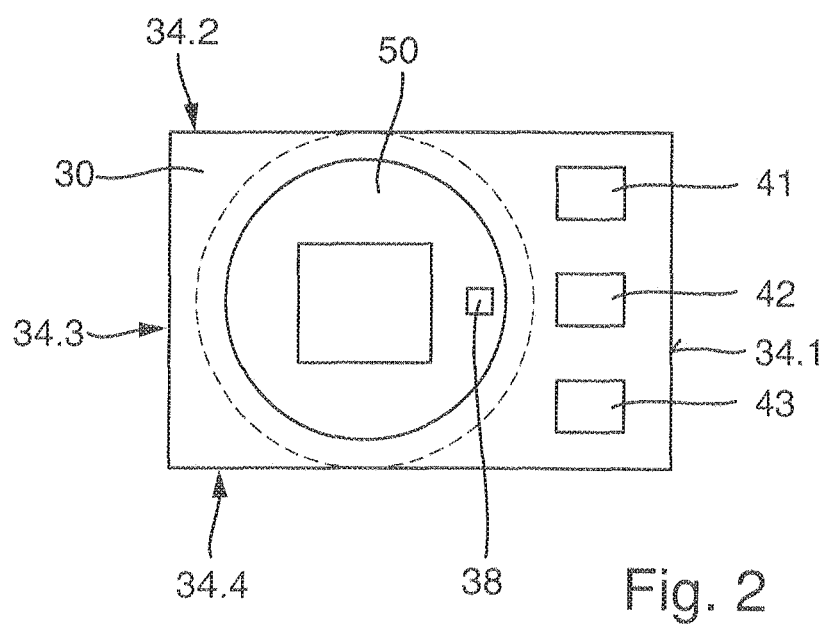
FIG. 2 shows a schematic top view of an embodiment of the invention of a solar cell unit.

As can be seen in FIG. 2, carrier 30 has a rectangular top side 32, surrounded by four edges 34.1, 34.2, 34.3, 34.4. In the illustrated exemplary embodiment, a first, second, and third contact surface 40, 42, 43 are arranged in the indicated sequence next to secondary optical element 50 and along first edge 34.1 of carrier 30 on top side 32 of carrier 30.

In an alternative embodiment (shown by the dashed line), the distance of the bottom side of secondary optical element 50 is in a range between 0 mm and 0.25 mm away from edges 34.2, 34.3, and 34.4, i.e., virtually flush.

Figure 3:
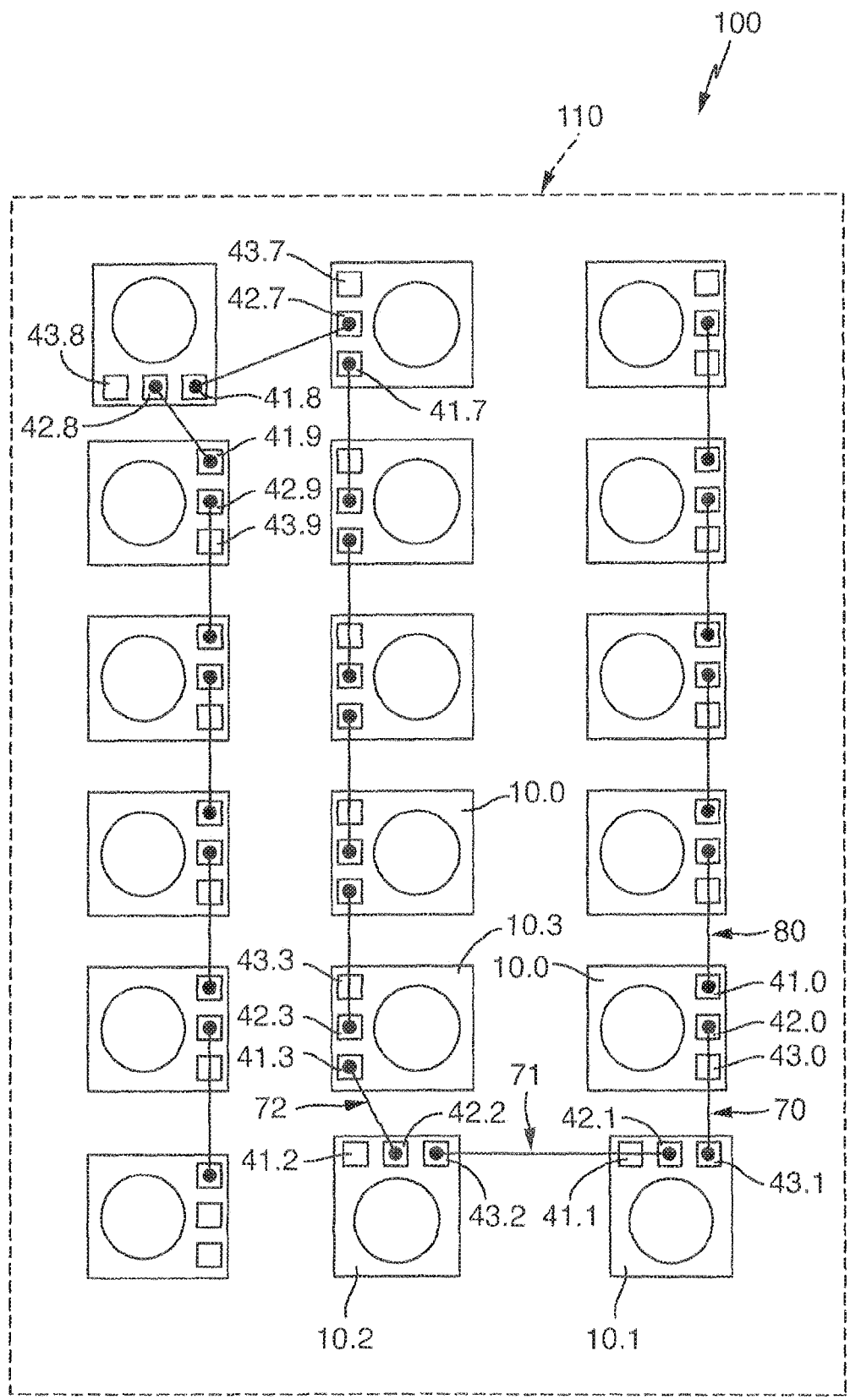
FIG. 3 shows a schematic top view of an embodiment of the invention of a solar cell module.

A first embodiment of solar cell module 100 is shown schematically in the illustration of FIG. 3. The solar cell module has a plurality of solar cell units 10.0, 10.1, 10.2, 10.3 of the above-described type, which are arranged meander-shaped and connected in series. Solar cell units 10.0, 10.1, 10.2, 10.3 are each arranged with a bottom side on a surface 120 of a base plate 110.

A zeroth solar cell unit 10.0 outwardly has a connector 80, connected in an electrically conductive manner to second contact surface 42.0, whereby first contact surface 41.0 is connected by a zeroth metallic connecting element 70 to a second contact surface 42.1 of a first solar cell unit 10.1.

A third contact surface 43.1 of first solar cell unit 10.1 is connected by a first metallic connector 71 to a second contact surface 42.2 of second solar cell unit 10.2, whereby first metallic connector 71 in a projection, extending perpendicular to surface 120 of base plate 110, overlaps first contact surface 41.2 of the second solar cell unit 10.2. A third contact surface 43.2 of first solar cell unit 10.2 is connected by a second metallic connecting element 72 to a second contact surface 42.3 of third solar cell unit 10.3.

Crossing of second metallic connecting element 72 with first metallic connecting element 71 is prevented by the presence of third contact surface 43.2 of second solar cell unit 10.2, said surface having the same polarity as first contact surface 41.2. If third contact surface 43.2 were not present, then second connecting element 72 would have to be contacted with first contact surface 41.2 of second solar cell unit 10.2 and would therefore cross or overlap with first metallic connecting element 71 in a projection perpendicular to surface 120 of base plate 110. The risk of a short circuit by crossing of connecting elements can be prevented in a simple manner by the arrangement of the invention.

A further crossing-free arrangement via the two metallic connecting elements is shown by the electrical connection in the form of a series connection of contact surfaces 41.7, 42.7, and 43.7 with contact surfaces 41.8, 42.8, and 43.8, and further with the connection to contact surfaces 41.9, 42.9, and 43.9.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A solar cell unit comprising:
a semiconductor body formed as a solar cell, the semiconductor body having a front side and a back side and a first terminal contact with a first polarity and a second terminal contact with a second polarity, the first polarity being different than the second polarity;
a carrier with a top side and a bottom side, a first contact surface and a second contact surface are formed on the top side of the carrier, the first contact surface being spaced apart from the second contact surface, the first and second contact surfaces being metallically conductive and electrically connected to the two terminal contacts, and the back side of the semiconductor body being non-positively connected to the top side of the carrier; and
a secondary optical element configured to guide light to the front side of the semiconductor body, the secondary optical element having a bottom side that is non-positively connected to the front side of the semiconductor body,
wherein the carrier has a third contact surface formed on the top side,
wherein the third contact surface is spaced apart from both the first contact surface and the second contact surface, and
wherein the second contact surface has a different polarity than the first contact surface and the third contact surface.

2. The solar cell unit according to claim 1, wherein at least a portion of the bottom side of the secondary optical element are non-positively connected to the front side of the semiconductor body and/or to the top side of the carrier by an adhesive layer.

3. The solar cell unit according to claim 1, wherein the first contact surface and the third contact surface are electrically connected to the first terminal contact and the second contact surface is electrically connected to the second terminal contact, or wherein the first contact surface and the third contact surface are electrically connected to the second terminal contact and the second contact surface is electrically connected to the first terminal contact.

4. The solar cell unit according to claim 1, wherein the carrier has four edges on the top side and the first contact surface, second contact surface, and third contact surface are arranged in an indicated sequence along the first edge on the top side of the carrier.

5. The solar cell unit according to claim 1, wherein the carrier is formed quadrangular on the top side.

6. The solar cell unit according to claim 1, wherein, in a projection extending substantially perpendicular to the top side of the carrier, the lateral distance of the bottom side of the secondary optical element from the first edge of the top side of the carrier is at least 1 mm and a distance from a second edge, from a third edge, and from a fourth edge is at most 10 mm.

7. The solar cell unit according to claim 1, wherein, in a projection extending substantially perpendicular to the top side of the carrier, the first, second, and third contact surfaces are arranged spaced apart from the bottom side of the secondary optical element.

8. The solar cell unit according to claim 1, wherein the secondary optical element having a convex surface, facing away from the semiconductor body, is formed lens-shaped or funnel-shaped.

9. The solar cell unit according to claim 1, wherein the secondary optical element is made as a single piece.

10. The solar cell unit according to claim 1, wherein the adhesive layer comprises a plastic compound.

11. The solar cell unit according to claim 1, wherein the carrier is formed as a ceramic printed circuit board or a printed circuit board with an insulated metal substrate.

12. The solar cell unit according to claim 1, wherein the first contact surface, the second contact surface, and the third contact surface are each formed as traces or as soldering lugs.

13. The solar cell unit according to claim 1, wherein the first terminal contact is formed on the front side and the second terminal contact on the back side or wherein the first and second terminal contacts are formed on the front side or wherein the first and second terminal contacts are formed on the back side.

14. The solar cell unit according to claim 1, wherein the secondary optical element comprises a glass compound or a quartz glass compound or is formed of both.

15. The solar cell unit according to claim 1, wherein a carrier has a first contact surface formed on a top side of the carrier and has a second contact surface formed on the top side of the carrier that is spaced apart from the first contact surface.

16. A solar cell module comprising:
- at least one first, a second, and a third solar cell unit according to claim 1;
- at least one first metallic connecting element; and
- at least one second metallic connecting element,
- wherein the three solar cell units are arranged in the indicated sequence each with the bottom side on a base plate,
- wherein the first metallic connecting element electrically connects the second contact surface of the first solar cell unit to the first contact surface of the second solar cell unit,
- wherein the second metallic connecting element connects the second contact surface of the second solar cell unit to the first contact surface of the third solar cell unit, and
- wherein the first metallic connecting element in a projection extending substantially perpendicular to the surface of the base plate, overlaps the first contact surface of the first solar cell unit.

17. The solar cell module according to claim 15, wherein the base plate comprises a nonmetal or a metal or a plastic or a glass-fiber-reinforced plastic material or is formed of one such material.

* * * * *